INTEGRATED SEMICONDUCTIVE DEVICE

Filed Aug. 16, 1960 2 Sheets-Sheet 1

INVENTORS W. J. GRUBBS, JR.
M. E. HINES
L. J. VARNERIN, JR.
BY A. J. Torsiglieri
ATTORNEY INVENTORS W. J. GRUBBS, JR.
M. E. HINES
L. J. VARNERIN, JR.
BY A. J. Torsiglieri
ATTORNEY United States Patent Office 3,021,459

Patented Feb. 13, 1962

3,021,459

INTEGRATED SEMICONDUCTIVE DEVICE

William J. Grubbs, Jr., New Brunswick, Marion E. Hines, Summit, and Lawrence J. Varnerin, Jr., Murray Hill, N.J., assignors to Bell Telephone Laboratories, Incorporated, New York, N.Y., a corporation of New York Filed Aug. 16, 1960, Ser. No. 50,029
5 Claims. (Cl. 317—234)

This invention relates to semiconductive devices and more particularly to such devices which exhibit unilateral or nonreciprocal characteristics.

Currently, there is a great deal of interest in the Esaki or tunnel diode. This is a diode comprising a semiconductive wafer which includes a narrow P-N junction separating two degenerate regions such that for an appropriate forward bias across the junction quantum-mechanical tunneling through the junction results in a negative resistance characteristic. This negative resistance is useful to provide amplification of an input signal.

One of the problems that complicates the use of a tunnel diode is the fact that it is a two-terminal device and, as a consequence, is not inherently characterized by isolation between its input and output branches. This factor can give rise to instability problems particularly when tunnel diodes are cascaded to provide successive stages of amplification. Accordingly, when tunnel diodes are used in a multistage amplifier, it is desirable to provide isolation between successive stages whereby the signal transmission will be unilateral along the multistage amplifier.

The basic principles of a multistage amplifier formed by a succession of negative resistance elements separated by isolators are described in United States Patent 2,775,658, which issued December 25, 1956, to W. P. Mason and W. Shockley. The amplifier there described was made up of successive stages each of which included a four-terminal Hall-effect element which provided the desired isolation and a two-terminal negative resistance element which provided the gain.

The present invention relates primarily to an integrated device which provides in a unitary structure both a tunnel diode useful for providing a negative resistance and a Hall-effect element useful for providing isolation whereby there results an amplifier in which the input and output branches are isolated so that unidirectional amplification results. Such an amplifier can be cascaded with a minimum of instability problems. By integrating the two functions in a unitary structure, a more compact arrangement results and also there can be reduced the stray or parasitic inductance usually associated with a combination of two discrete elements.

In an illustrative embodiment of an invention of this kind, a semiconductive wafer whose bulk is of one conductivity type is provided with a limited region of the opposite conductivity type for forming a localized P-N junction. The characteristics of the wafer are such that by providing two electrodes close to, but on opposite sides of, the wafer a tunnel diode characteristic can be measured between the two electrodes. In addition, the bulk of the wafer is provided with three other electrodes positioned such that in a magnetic field there can be measured between pairs of alternate electrodes connected to the bulk an isolator characteristic. Additionally, the electrode to the limited region of the wafer is connected by a low resistance path, which is insulated from the wafer, to the electrode opposite that with which it forms the tunnel diode.

In a broader aspect, the invention relates to the integration in a wafer designed to serve as a Hall-effect element of one or more tunnel diodes. In particular, instead of serving as an isolator, the Hall-effect element may serve as a gyrator or circulator in known fashion.

The invention will be better understood from the following more detailed description, taken in conjunction with the accompanying drawing, in which.

Figure 1:
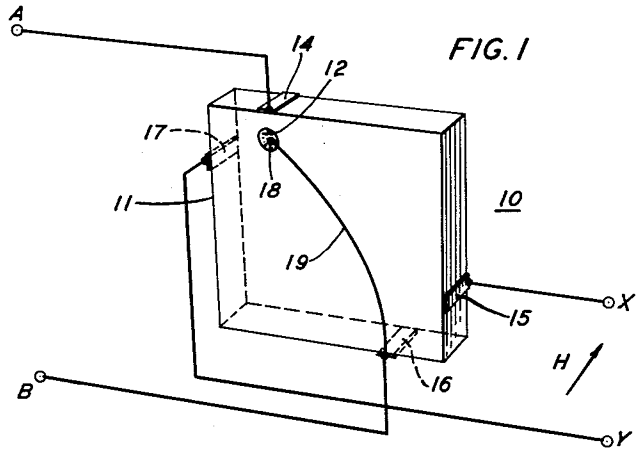
FIG. 1 shows an illustrative embodiment of the invention in which the input and output terminals do not have a common ground and are unbalanced to ground for direct currents.

With reference now more particularly to the drawing, in FIG. 1 the monocrystalline germanium wafer 10 whose geometry is that of a rectangular parallelopiped with square major faces includes a gross portion 11 which, in this illustrative embodiment, is n-type and a restricted portion 12 of opposite or p-type conductivity for forming a narrow P-N junction 13. The zone 12 advantageously is shallow and does not penetrate completely through the wafer. Electrodes 14, 15, 16 and 17 make separate low resistance connections to the four edges of the wafer. The electrodes are positioned asymmetrically around the wafer such that when a steady magnetic field H, shown schematically, of a suitable operating level is applied to be perpendicular to the major faces of the wafer, opposite electrodes 14 and 16 form one pair of terminals AB of an isolator and opposite electrodes 15 and 17 form the other pair of terminals XY of the isolator.

The principles of a "skew" isolator of this kind are known to workers in the art and are described in a paper entitled "Solution of the Field Problem of the Germanium Gyrator," in the Journal of Applied Physics, volume 6, pages 741 through 756, June 1954.

Additionally, there is provided to the restricted portion 12 an electrode 18 which makes a low resistance connection to it. The characteristics of the wafer at the region close to the rectifying junction are such that there is realized the characteristic of a tunnel diode between electrodes 14 and 18 in the absence of any other connections to the wafer, i.e., for an appropriate value of applied forward bias across the junction there results a negative resistance between electrodes 14 and 18. The principles of a tunnel diode are now well known. To achieve the desired characteristic it is important to provide a P-N junction which has a narrow space charge layer separating two regions of degenerate material. Typically, the bulk portion 11 of the wafer may be arsenic-doped germanium and the restricted portion 12 an aluminum alloy region.

Additionally, a low resistance path 19 external to the wafer is provided between electrodes 16 and 18. This may be a conductive strip superposed on an insulating film over a major face of the wafer.

Figure 4:
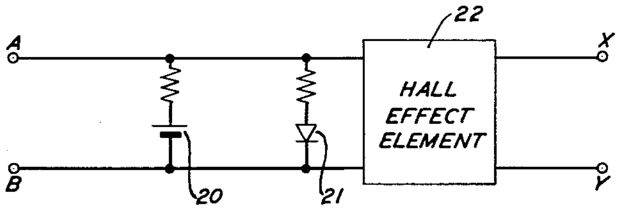
FIGS. 4, 5 and 6 are simplified circuit schematics of the devices shown in FIGS. 1, 2 and 3, respectively.

FIG. 4 shows the circuit schematic of the device described in which AB form the input terminals and XY the output terminals. Provision is made for applying from D.-C. source 20 the required forward bias for the desired negative resistance effect. The input signal to be amplified is applied across the input terminals AB and the load or utilization means is connected across the output terminals XY. In circuits where a plurality of these elements are cascaded, the output of a preceding stage can serve as the input of the subsequent stage provided the impedances are properly matched. As shown, the equivalent circuit comprises a tunnel diode 21 connected across the input terminals and an isolator 22 interposed between the input and output terminals for isolating the input terminals from the output terminals.

As can be seen from the equivalent circuit schematic the input conductance of the isolator serves as the diode shunting load conductance. Since the input conductance of the isolator can typically be low, it is well suited to the requirements on the tunnel diode shunting load for amplifier applications.

The inductance L shown in series with the diode is associated with the loop formed by the low resistance path 19 from electrode 18 to 16 and the return path in the wafer. The inductance L desirably is as small as possible for maximum stability. The described arrangement is well suited to this requirement since the low resistance path can be formed by a film over the wafer which will exhibit a small inductance. In this respect, the integrated device described can be superior to the combination of two separate elements.

The structure described can readily be modified to provide additionally a tunnel diode effectively shunted between terminals XY in accordance with the same principles. To this end, there would be provided adjacent electrode 15 in the wafer a localized region of conductivity type opposite that of the bulk analogous to zone 12 adjacent electrode 14. Additionally, a low resistance path external to the wafer, analogous to path 19, would be provided between a connection to this localized zone and electrode 17.

Figure 2:
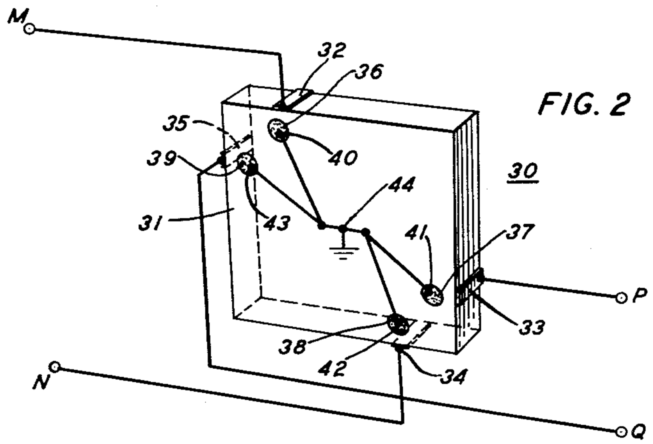
FIG. 2 shows an illustrative embodiment of the invention in which the input and output terminals are balanced to ground for direct currents.

When the described arrangements are used, there can be no ground common to both the input and output terminals. However, it is possible to devise an embodiment of the invention in which both the input and output terminals are balanced with respect to ground for direct currents. Such an embodiment is shown in FIG. 2.

This embodiment comprises a monocrystalline germanium wafer 30 which can have the same geometry as that of the device shown in FIG. 1. The wafer includes a bulk portion 31 which, in this embodiment, may be n-type. Each of electrodes 32, 33, 34 and 35 makes a low resistance connection to a different one of the four edges of the bulk portion of the wafer. As above, the electrodes are asymmetrically disposed to form a skew isolator. Electrodes 32, 34 can be considered to form the input terminals MN and electrodes 33, 35 the output terminals PQ of the isolator.

Additionally, the wafer includes four shallow localized zones 36, 37, 38 and 39 of p-type conductivity. Each of these zones is located adjacent a different one of the four electrodes 32, 33, 34 and 35. Separate electrodes 40, 41, 42 and 43 are provided to the four p-type zones. Each of these electrodes is connected by a low resistance path external to the wafer to a common ground 44. Advantageously, each of these paths may be a conductive strip on a face of the wafer but insulated therefrom. The common ground may be a conductive mass insulated from the wafer and on which the wafer is supported, such as the header, or the ground may be electrically connected to the center of the wafer, as shown.

As above, the characteristics of the wafer are made such that a tunnel diode characteristic is measurable between each of the four pairs of adjacent electrodes, such as 32, 36 if it is not shunted by the wafer conductance.

Figure 5:
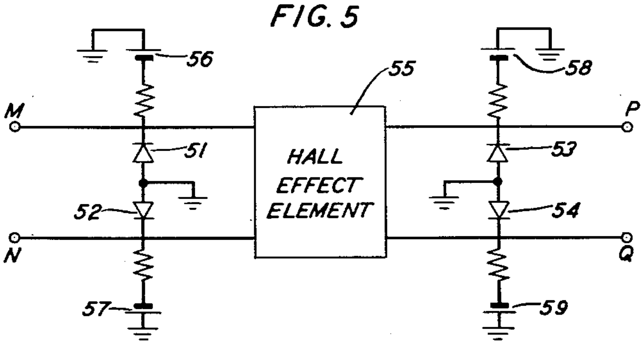

FIG. 5 shows the equivalent circuit schematic of the device of FIG. 2. In particular, a pair of tunnel diodes 51, 52 in series opposition are shunted across the input terminals MN and a similar pair 53, 54 are shunted across the output terminals PQ of the isolator 55. The point intermediate between diodes 51, 52 and the point intermediate between diodes 53, 54 are connected to ground. Separate D.-C. voltage sources 56, 57, 58 and 59 are used to bias the diodes.

It is possible to dispense with either pair of diodes to provide an arrangement more like that shown in FIG. 4 in which tunnel diodes are shunted across only one pair of terminals.

To this end, for example, diodes 53 and 54 shown in FIG. 5 can be eliminated by eliminating from the wafer shown in FIG. 2 localized regions 37 and 39 as well as their connections to the common ground. Alternatively, diodes 51 and 52 can be eliminated by eliminating localized regions 38 and 40 and their connections to the common ground.

In each of the described arrangements, the desired isolation properties are achieved by locating the electrodes connected to the bulk asymmetrically. Alternatively, as is known to workers in the art, the desired effect can be achieved in a symmetric structure by attaching impedances between appropriate pairs of the electrodes as described in the aforementioned patent. In the absence of such added impedances a symmetric structure serves as a gyrator, i.e., it exhibts a difference of 180 degrees in the two directions of transmission through it. The invention also has application to such gyrators in serving at least to reduce the transmission loss associated with such a device. Such embodiments differ from those described only in the use of a symmetric arrangement of electrodes.

The principles of the invention additionally have application to use with a three-terminal Hall-effect element useful either as a gyrator or isolator of the kind described in United States Patent 2,794,864 which issued to W. Shockley on June 4, 1957. In particular, FIG. 3 represents a device whose equivalent circuit is that shown in FIG. 6 of the patent and FIG. 6 of this application.

Figure 3:
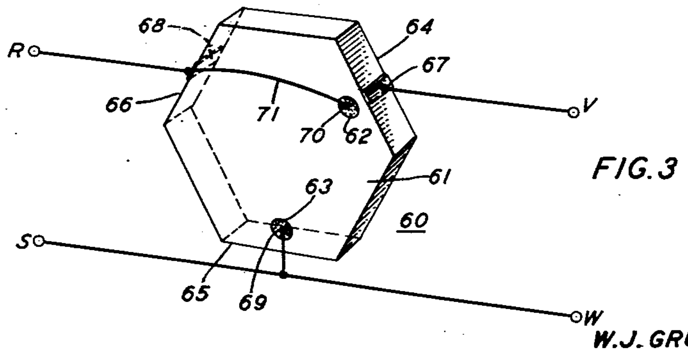
FIG. 3 shows an illustrative embodiment in which a three-terminal Hall-effect element is used.

With reference now to FIG. 3, the germanium monocrystalline wafer 60, which is a slice whose parallel major faces are hexagonal, has a bulk portion 61 which in this illustrative embodiment is n-type and includes two discrete portions 62 and 63 which are p-type. Each of portions 62 and 63 is located adjacent a different edge of the wafer, the two edges 64, 65 affected being two of a set of three edges 64, 65, 66, no two of which are contiguous. Electrodes 67 and 68 make a low resistance connection at edges 64 and 66, respectively, to the n-type bulk. Electrodes 69 and 70 make low resistance connections to p-type zones 62 and 63, respectively. A low resistance path 71 is provided between electrodes 68 and 70.

The characteristics of the wafer are such that terminals RS connected, respectively, to electrodes 68 and 69 serve as the input terminals, and terminals VW connected, respectively, to electrodes 67 and 69 serve as the output electrodes. Additionally, the junctions formed between regions 62 and 63 and the bulk are designed to provide a tunnel diode characteristic between connections on opposite sides of the junction.

Figure 6:
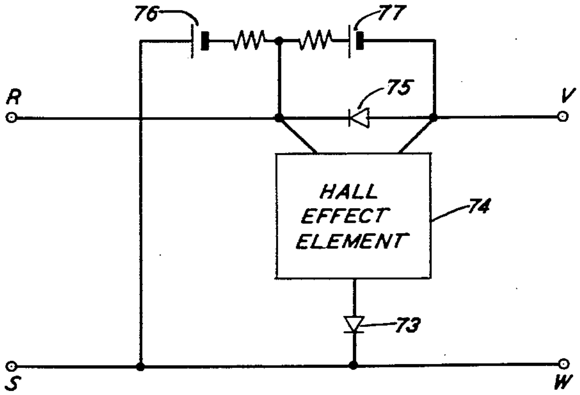

The equivalent circuit is shown in FIG. 6. A tunnel diode 73 is inserted serially in the leg of the three-terminal Hall-effect element 74 which is common to terminals S and W, and a tunnel diode 75 is connected in shunt to terminals R and V. Separate D.-C. sources 76 and 77 are used to provide the required bias on the diodes 73 and 75, respectively.

The principles of the invention can be further extended to provide a device whose equiavlent circuit is essentially that shown in FIG. 7 of the last-mentioned Shockley patent. In this case it is important to bias tunnel diodes incorporated into the structure to different operating points. In other instances, too, it may be desirable to bias the various tunnel diodes incorporated into a structure to different operating points.

The invention also finds application with more complex forms of Hall-effect devices, such as circulators, of the kind shown in FIG. 6 of United States Patent 2,774,890 which issued on December 18, 1956, to C. L. Semmelman. In such applications, the inclusion of one or more tunnel diodes can be used to reduce the transmission loss in a favored direction.

From the foregoing, it should be obvious that the embodiments described are merely illustrative of the principles of the invention and that various other embodiments are feasible. Moreover, it should be evident that the specific designs described are merely exemplary. In particular, the wafer can be of various other semiconductive materials, such as silicon, silicon-germanium alloys, and group III–group V compounds, for example, gallium arsenide, indium arsenide, and indium antimonide. The favored materials are those which are most useful as Hall-effect elements and tunnel diodes. Moreover, considerable variation in the geometry of the Hall-effect element is possible since exact or particular geometries are not essential as is known to workers in the Hall-effect elements art.

What is claimed is:

1. A semiconductive device comprising a semiconductive wafer which serves as a Hall-effect element, the bulk of which is of one conductivity type and at least one localized portion of which is of the opposite conductivity type, the junction formed therebetween being such that a tunnel diode characteristic results across opposite sides of the junction, a plurality of electrodes connected to the wafer such that in a steady magnetic field nonreciprocal properties result between different pairs of electrodes, and means forming at least one low resistance path external to the wafer interconnecting two electrodes, at least one of which is connected to a localized portion of the wafer.

2. A semiconductive device comprising a semiconductive wafer which serves as a Hall-effect element, the bulk of which is of one conductivity type and a localized portion of which is of the opposite conductivity type, four electrodes connected to the bulk portion of the wafer spaced apart such that when a steady magnetic field is applied normal to the plane of the wafer nonreciprocal transmission characteristics result between pairs of opposed electrodes, one of said electrodes being adjacent to the localized portion, an additional electrode connected to said localized portion, and means forming a low resistance path between said additional electrode and the electrode opposite the electrode which is connected adjacent the localized portion, the wafer being such that a tunnel diode characteristic results between the electrode connected to the localized portion and the electrode connected adjacent such portion.

3. A semiconductive device comprising a semiconductive wafer which serves as a Hall-effect element, the bulk of which is of one conductivity type and four spaced portions of which are of the opposite conductivity type, four electrodes connected to the wafer such that in a steady magnetic field nonreciprocal properties result between pairs of oppositely disposed electrodes, the four portions of opposite conductivity type being localized close to the four electrodes, respectively, means external to the wafer interconnecting said four localized regions by a low resistance path, the wafer being such that a tunnel diode characteristic results across opposite sides of each of the four junctions formed between the portions and the bulk.

4. A semiconductive device comprising a Hall-effect element, the bulk of which is of one conductivity type and two spaced localized portions of which are of the opposite conductivity type, input and output pairs of terminals connected to the element between which the element exhibits nonreciprocal characteristics when placed in a magnetic field, each pair including a connection to a different portion of the bulk and a connection to the same localized portion, the connection of one pair to the bulk also connecting to the other localized portion, the localized portions forming tunnel diodes with adjacent portions of the bulk.

5. A semiconductive device comprising a semiconductive wafer including one portion useful as a Hall-effect element and a portion useful as a tunnel diode and means comprising a plurality of electrodes connected to the wafer for utilizing the combined effect of a Hall-effect element and tunnel diode.

References Cited in the file of this patent

UNITED STATES PATENTS

| | | |
|---|---|---|
| 2,736,822 | Dunlap | Feb. 28, 1956 |
| 2,909,679 | Abraham | Oct. 20, 1959 |